US010962456B2

(12) United States Patent
Han et al.

(10) Patent No.: US 10,962,456 B2
(45) Date of Patent: Mar. 30, 2021

(54) FLEXIBLE DISPLAY AUXILIARY DEVICE AND FOLDABLE MOBILE TERMINAL

(71) Applicant: Wuhan China Star Optoelectronics Semiconductor Display Technology Co., Ltd., Hubei (CN)

(72) Inventors: Wen Han, Hubei (CN); Rong Ma, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 728 days.

(21) Appl. No.: 15/735,515

(22) PCT Filed: Nov. 23, 2017

(86) PCT No.: PCT/CN2017/112626
§ 371 (c)(1),
(2) Date: Dec. 11, 2017

(87) PCT Pub. No.: WO2019/052007
PCT Pub. Date: Mar. 21, 2019

(65) Prior Publication Data
US 2020/0032952 A1 Jan. 30, 2020

(30) Foreign Application Priority Data
Sep. 14, 2017 (CN) .......................... 201710846596.0

(51) Int. Cl.
*G01N 3/20* (2006.01)
*F16M 13/00* (2006.01)
(Continued)

(52) U.S. Cl.
CPC ............. *G01N 3/20* (2013.01); *F16M 13/005* (2013.01); *G01M 5/005* (2013.01);
(Continued)

(58) Field of Classification Search
CPC ............. G01N 3/20; G01N 2203/0282; G01N 2203/0617; G01N 2203/0023;
(Continued)

(56) References Cited

U.S. PATENT DOCUMENTS

2012/0067134 A1 3/2012 Bell et al.

FOREIGN PATENT DOCUMENTS

CN 106157819A A 11/2016
CN 106601130A A 4/2017
(Continued)

*Primary Examiner* — Ryan D Walsh
(74) *Attorney, Agent, or Firm* — Hemisphere Law, PLLC; Zhigang Ma

(57) ABSTRACT

The present disclosure discloses a flexible display auxiliary device and a foldable mobile terminal. The flexible display auxiliary device includes a platform, a first stage, a second stage, a sliding mechanism and an enabling mechanism. The first stage is used for fixing the first end of the flexible display screen, the second stage is used for fixing the second end of the flexible display screen opposite to the first end. The second stage is fixedly arranged on the sliding mechanism, the sliding mechanism is arranged on the platform, the enabling mechanism is connected to the sliding mechanism to control the sliding mechanism to move on the platform so as to change the relative distance between the first stage and the second stage and change the tension on the flexible display screen. In the above manner, the present disclosure enables the flexible display to always be in a flat state.

16 Claims, 1 Drawing Sheet

(51) Int. Cl.
  *H04B 1/3827* (2015.01)
  *H05K 5/00* (2006.01)
  *H01L 51/00* (2006.01)
  *G09G 3/00* (2006.01)
  *G01M 5/00* (2006.01)
  *G02F 1/13* (2006.01)
  *G06F 1/16* (2006.01)

(52) U.S. Cl.
  CPC .......... *G02F 1/1309* (2013.01); *G06F 1/1652* (2013.01); *G09G 3/006* (2013.01); *H01L 51/0097* (2013.01); *H04B 1/3827* (2013.01); *H05K 5/0017* (2013.01); *G01N 2203/0023* (2013.01); *G01N 2203/0282* (2013.01); *G01N 2203/0617* (2013.01); *G09G 2380/02* (2013.01); *H01L 2251/5338* (2013.01); *H01L 2924/12044* (2013.01)

(58) Field of Classification Search
  CPC . G06F 1/1652; H01L 51/0097; H01L 5/0017; H01L 2924/12044; H01L 2251/5338; G09G 3/006; G09G 2380/02; G01M 5/005; G02F 1/1309; F16M 13/005; H04B 1/3827; H05K 5/0017
  See application file for complete search history.

(56) References Cited

FOREIGN PATENT DOCUMENTS

| | | | |
|---|---|---|---|
| CN | 206097002 U | 4/2017 | |
| CN | 107014700A A | 8/2017 | |
| CN | 107102692 A | 8/2017 | |
| KR | 20120010801 A | * 2/2012 | |
| KR | 20160033832 A | * 3/2016 | ........... G01R 1/0408 |

* cited by examiner

FLEXIBLE DISPLAY AUXILIARY DEVICE AND FOLDABLE MOBILE TERMINAL

RELATED APPLICATIONS

The present application is a National Phase of International Application Number PCT/CN2017/112626, filed Nov. 23, 2017, and claims the priority of China Application No. 201710846596.0, filed Sep. 14, 2017.

FIELD OF THE DISCLOSURE

The present disclosure relates to a display device field, and more particularly to a flexible display auxiliary device and a foldable mobile terminal.

BACKGROUND OF THE DISCLOSURE

A flexible display is a foldable display device that is made of a soft material, wherein the flexible display uses phosphorescent OLED technology, this technology is characterized by low power consumption, small size, flexible and visual. Therefore, the flexible display receives more and more attention because of the advantages of being thin and light, not friable, bendable and wearable.

However, the flexible display is extremely prone to wrinkles and warpage in the bent or folded state, which seriously affects the display effect and the service life of the flexible display.

SUMMARY OF THE DISCLOSURE

The technical problem to be solved by the present disclosure is to provide a flexible display auxiliary device and a foldable mobile terminal so that the flexible display can always be in a flat state.

To solve the above technical problem, one technical solution adopted by the present disclosure is to provide a flexible display auxiliary device, including: a platform, a first stage, a second stage, a sliding mechanism, and an enabling mechanism. Wherein the first stage is configured to fix a first end of the flexible display, and the second stage is configured to fix a second end of the flexible display opposite to the first end. The first end surface of the first stage is arranged on the platform, the first stage is away from the platform relative to the second end surface of the first end surface, so that the first stage and the platform are set at a set angle. The second stage is fixedly arranged on the sliding mechanism, a sliding rail is arranged on the platform, the sliding mechanism is arranged on the sliding rail and is movable in an extending direction of the sliding rail, the enabling mechanism is connected to the sliding mechanism to control the sliding mechanism to move on the platform so as to change a relative distance between the first stage and the second stage, thereby a tension on the flexible display is changed.

In order to solve the above technical problem, one technical solution adopted by the present disclosure is to provide a flexible display auxiliary device, including: a platform, a first stage, a second stage, a sliding mechanism, and an enabling mechanism. Wherein the first stage is configured to fix a first end of the flexible display, and the second stage is configured to fix a second end of the flexible display opposite to the first end. The first stage is fixedly arranged on the platform. The second stage is fixedly disposed on the sliding mechanism, the sliding mechanism is arranged on the platform, the enabling mechanism is connected to the sliding mechanism to control the sliding mechanism to move on the platform, a relative distance between the first stage and the second stage is changed so that a tension on the flexible display is changed.

In order to solve the above technical problem, another technical solution adopted by the present disclosure is to provide a foldable mobile terminal including a flexible display and an auxiliary device, wherein the auxiliary device is an auxiliary device as described above.

The beneficial effects of the present disclosure are as follows: different from the prior art, the flexible display auxiliary device in the present disclosure includes a platform, a first stage, a second stage, a sliding mechanism and an enabling mechanism. Wherein the first stage is configured to fix a first end of the flexible display, and the second stage is configured to fix a second end of the flexible display opposite to the first end. The first stage is fixedly arranged on the platform. The second stage is fixedly disposed on the sliding mechanism, the sliding mechanism is arranged on the platform, the enabling mechanism is connected to the sliding mechanism to control the sliding mechanism to move on the platform, a relative distance between the first stage and the second stage is changed so that a tension on the flexible display is changed, such that the flexible display can always be in a flat state when it is folded and flattened, so as to improve the service life of the flexible display.

DETAILED DESCRIPTION OF PREFERRED EMBODIMENTS

The following describes the present disclosure in detail with reference to the specific embodiments and the accompanying drawings.

Figure 1:
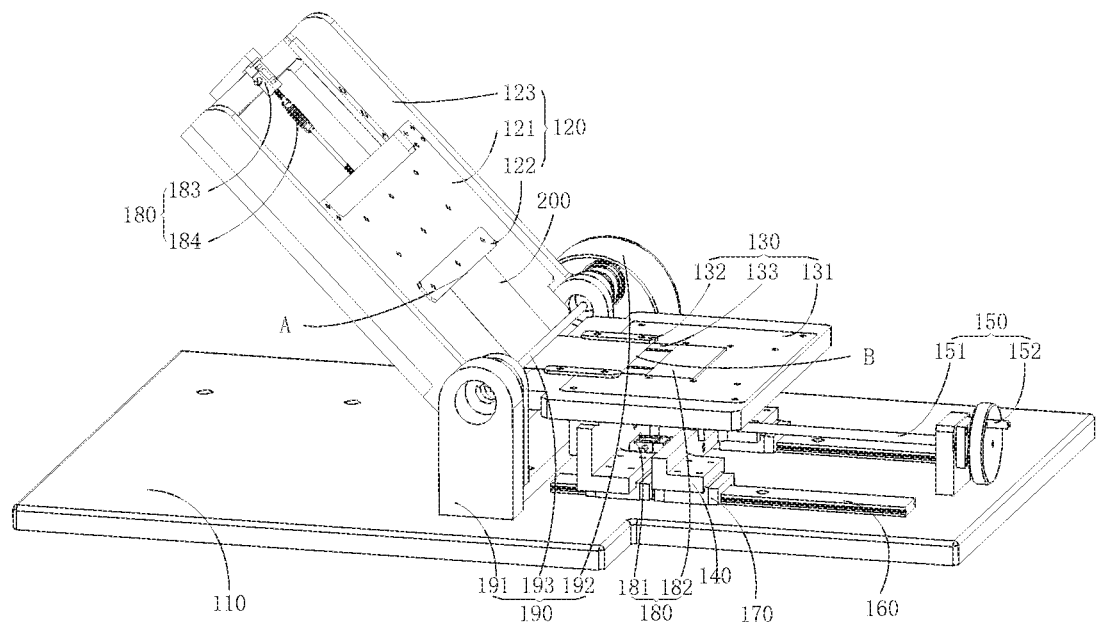
FIG. 1 is a schematic structural diagram of an embodiment of a flexible display auxiliary device according to the present disclosure.

Please referring to FIG. 1, FIG. 1 is a schematic structural diagram of an embodiment of a flexible display auxiliary device according to the present disclosure. As shown in FIG. 1, the flexible display auxiliary device of the present embodiment includes: a platform 110, a first stage system 120, a second stage system 130, a sliding mechanism 140, an enabling mechanism system 150, a sliding rail 160, a limit mechanism 170, a sensor system 180 and a support frame system 190. In addition, for convenience of description, the flexible display auxiliary device in the embodiment further includes a flexible display 200.

Wherein the first stage system 120 includes a first stage 121. The first stage 121 is used to fix a first end A of the flexible display 200. The second stage system 130 includes a second stage 131. The second stage 131 is used to fix a second end B opposite to the first end A of the flexible display 200.

The first stage 121 is fixedly arranged on the platform 110 through the support frame system 190; wherein the first stage 121 is fixedly arranged on a frame 123. Specifically, the first stage 121 is fixed on two rails of the frame 123. Two rails of the frame 123 are provided with screw holes. Corresponding screw holes are also provided in a region where the screw hole contacts the first stage 121. After the first stage 121 is arranged on the frame 123, the first stage 121 is fixed by a screw. In addition, one end of the first stage 121 and one end of the frame 123 are provided with a gap to arrange a sensor for detecting a displacement of the first stage 121 and further testing a rotation angle of the first stage 121. In addition, a pressing plate 122 for fixing the first end of the flexible display 200 is further arranged on the first stage 121.

In addition, the support frame system 190 further includes a cross bar 193 arranged between a support frame 191 and a support frame 192 for making a folding angle of the flexible display 200 the same as the angle between the second stage 131 and the platform 110.

The second stage 131 is fixedly arranged on the sliding mechanism 140, the sliding mechanism 140 is arranged on the platform 110, the enabling mechanism 150 is connected to the sliding mechanism 140 to control the sliding mechanism 140 to move on the platform 110 to change the relative distance between the first stage 121 and the second stage 131 so that the tension on the flexible display 200 is changed.

Specifically, the second stage 131 is further provided with a pressing plate 132 for pressing the second end B of the flexible display 200 so that the flexible display 200 can be closely attached to the second stage 131. As shown in FIG. 1, there are two pressing plates 132, which are arranged in parallel with the sliding rail 160, and are respectively press the two adjacent sides of the second stage 131 at the end B of the flexible display 200.

The sliding rail 160 is arranged on the platform 110. The sliding mechanism 140 is arranged on the sliding rail 160 and is movable along an extending direction of the sliding rail 160. More specifically, the sliding rail 160 is a convex strip, a strip-shaped groove is arranged on a side of the sliding mechanism 140 facing the sliding rail 160, the convex strip is embedded in the groove so that the sliding mechanism 150 moves along the extending direction of the convex strip 160. In addition, at least two limit mechanisms 170 are further arranged on the sliding rail 160, and at least two limit mechanisms 170 are arranged at two ends of the sliding mechanism 140 for locking the sliding mechanism 140 when the sliding mechanism 140 stops moving.

Specifically, the sliding mechanism 140 is a slider, the number of the slider is two, both of the sliders are fixedly arranged with the second stage 131. The sliding mechanism 140 is provided with two bar-shaped grooves corresponding to the two sliding rails 160. Optionally, a bar-shaped groove may also be arranged in the sliding mechanism 140, and only one corresponding sliding rail 160 may be provided. Optionally, only one slider may be provided in the sliding mechanism 140. Optionally, in the present embodiment, the manner of moving the second stage 131 may be rolling in addition to the sliding, and the roller may be arranged on the sliding mechanism 140. In addition, the sliding rail 160 may be omitted in the rolling manner.

Specifically, the enabling mechanism 150 may include a screw 151 and a handle 152. When the user rotates the handle 152, the screw 151 rotates according to the rotation of the handle 152, so that the sliding mechanism 140 changes its position.

The sensor system 180 in this embodiment includes a first sensor 181, a processor, and a display 182. The first sensor 181 connects the processor and the display 182. Specifically, the first sensor 181 is arranged in the sliding mechanism 140 for detecting the displacement of the sliding mechanism 140. The processor and the display 182 are arranged on the second stage 131 for converting the magnitude of the displacement of the sliding mechanism 140 detected by the first sensor 181 into an intensity value and displaying the intensity value on the display. Optionally, the processor and the display 182 may not be arranged on the second stage 131 and directly process the received displacement data of the first sensor 181 as a peripheral device. Optionally, the first sensor 181 may also be omitted, a sensor capable of testing and displaying the tension of the flexible display screen 200 may be directly arranged. In this case, the sensor is arranged on the second stage 131 and connected to the flexible display 200 through a connecting member 133. That is, the sensor is arranged at the terminal processor and the display 182 in this embodiment.

In addition, the sensor system 180 in the present embodiment further includes a second sensor 183 and a spring 184. The second sensor 183 is fixedly arranged on the frame 122. One end of the spring 184 is connected to the second sensor 183, and the other end of the spring 184 is connected to the first stage 121. Specifically, the second sensor 183 may be connected to the peripheral processing device to process the displacement measured by the second sensor 183.

When the first stage 121 is rotated to be parallel to the platform 110, the first stage 121 and the second stage 131 are equal to each other in height from the platform 110. In practical applications, the method of rotating the first stage 121 is similar to that of a flip-type smart phone. When the position of the second stage 131 is to be moved, the handle 152 may be directly rotated. In addition, when the second stage 131 is in the initial position (That is, the displacement displayed by the first sensor 181 is zero), the tension on the flexible display 200 is zero. When the second stage 131 is at the end of the other end of the sliding rail 160 (That is, the displacement displayed by the first sensor 181 is the maximum value), the tension on the flexible display 200 reaches a maximum value.

In other embodiments, the flexible display auxiliary device may also omit the sensor system 180 and/or the flexible display auxiliary device may also save the enabling mechanism 150. The user may change the position of the sliding mechanism 140 directly by applying a force to the sliding mechanism 140.

The flexible display auxiliary device in the present embodiment includes a platform, a first stage, a second stage, a sliding mechanism and an enabling mechanism. Wherein the first stage is used for fixing the first end of the flexible display and the second stage is used for fixing the second end of the flexible display opposite to the first end; the first stage is fixedly arranged on the platform; the second stage is fixedly arranged on the sliding mechanism, the sliding mechanism is arranged on the platform, and the enabling mechanism is connected to the sliding mechanism to control the sliding mechanism to move on the platform to change the relative distance between the first stage and the second stage to change the tension on the flexible display screen. So that the flexible display can always be in a flat state when it is folded and flattened, so as to improve the service life of the flexible display.

Figure 2:
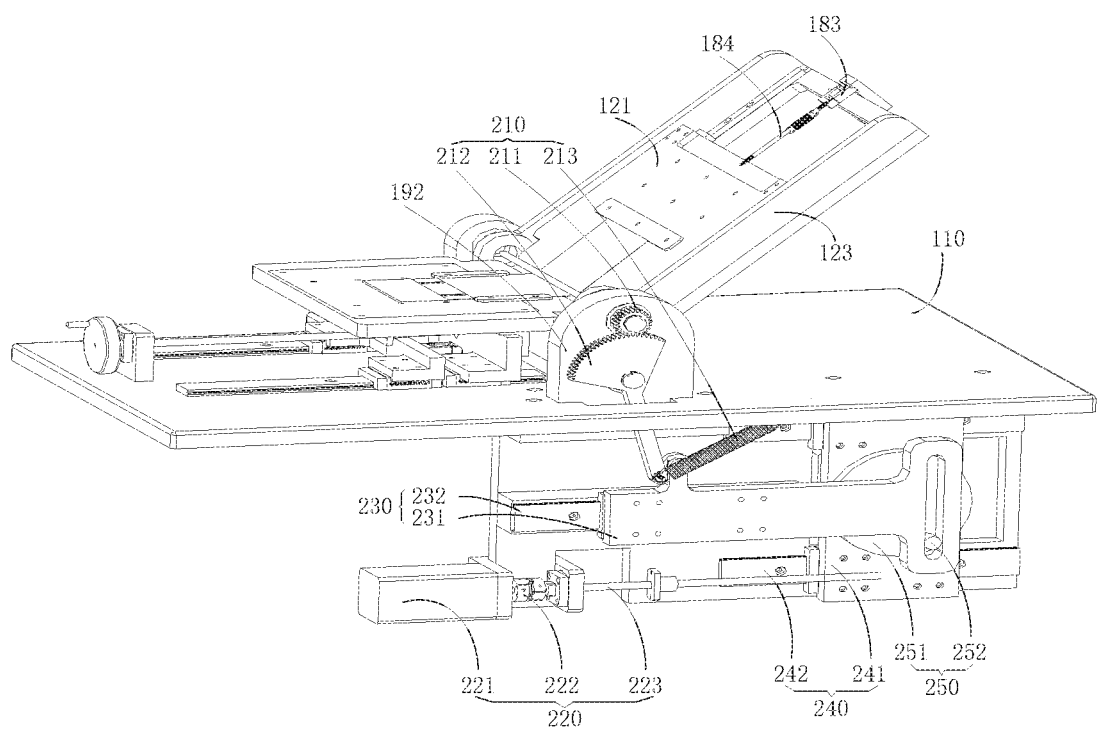
FIG. 2 is a schematic structural diagram of another embodiment of a flexible display auxiliary device according to the present disclosure.

Please referring to FIG. 2, FIG. 2 is a schematic structural diagram of another embodiment of a flexible display auxiliary device according to the present disclosure. As shown in FIG. 2, The flexible display auxiliary device of the present embodiment further includes a rotating mechanism 210, a first driving mechanism 220, a first slider 230, a second slider 240 and a second driving mechanism 250 in addition to the components of the above embodiments.

The rotating mechanism 210 includes a first rotating mechanism 211 and a second rotating mechanism 212. The first rotating mechanism 211 is fixedly connected with the frame 123 and leaks outside the support frame 191 through the accommodating hole of the support frame 192 to be connected with the second rotating mechanism 212. So that the first stage 121 can rotate in the axial direction formed by the first rotation mechanism 211 and the second rotation mechanism 212. Specifically, each of the first rotating mechanism 211 and the second rotating mechanism 212 is a gear, the first rotating mechanism 211 has a circular cross section, the second rotating mechanism 212 has a cross section of a fan shape. The outer surfaces of the first rotating mechanism 211 and the second rotating mechanism 212 are provided with gear teeth that can continuously mesh. The fan-shaped central point of the second rotating mechanism 212 is fixed on the support frame 192. A spring 213 is connected to the other side of the second rotating mechanism 212. The other end of the spring 213 is fixed on the platform 110.

At the connection between the second rotating mechanism 212 and the spring 213, a first slider 230 capable of pushing the second rotating mechanism 212 to move is provided. The first slider 230 includes a slider 231 and a rail 232 for supporting the slider 231 and sliding the slider 231. The other end of the slider 231 is connected with a second driving mechanism 250. The second driving mechanism 250 includes a rotating disc 251 and a handle 252. The handle 252 is fixed on the rotating disc 251. In which a protrusion (not shown in FIG. 2) is provided at the center of the other side of the rotating disk 251, the protrusion is also connected to a motor for controlling the rotation of the rotating disc 251 so as to finely adjust the rotation angle of the second rotating mechanism 212 so as to finely adjust the angle between the first stage 121 and the platform 110. Specifically, a receiving hole is formed at the connection between the slider 231 and the second driving mechanism 250 to receive the handle 252, so that the slider 231 can be changed in position according to the movement of the handle 252. In addition, a second slider 240 is connected to the other side of the rotating disk 251. The second slider 240 includes a slider 241 and rails 242 for supporting the slider 241 and sliding the slider 241. Two of the rails 242 are arranged on two sides of the slider 241. As shown in FIG. 2, one of the rails 242 is arranged near a region of the platform 110 and the other region of the rail 242 is away from the platform 110.

The slider 241 is also connected to a first driving mechanism 220. The first driving mechanism 220 includes a motor 221, a connecting member 222 and a screw 223. The connecting member 222 connects the motor 221 and the screw 223. The other end of the screw 223 is connected to the slider 241. When the motor 221 controls the rotation of the screw 223, the screw 223 drives the slider 241 to move on the rail 242. The slider 241 simultaneously drives the moving position of the slider 231 to adjust the rotation angle of the second rotating mechanism 212 so that the angle between the first stage 121 and the platform 110 can be adjusted.

In a specific embodiment, a motor connected to the rotating disk 251 (not shown in FIG. 2) and a motor 221 may be controlled by the terminal to issue a control instruction.

In addition to the platform, the first stage, the second stage, the sliding mechanism, and the enabling mechanism, the flexible display auxiliary device in the present embodiment further includes a rotating mechanism, a driving mechanism and a slider, which can control the rotation of the first stage assisted by the flexible display, so as to test the folding times of the flexible display, and in the process of testing the folding limit of the flexible display, the flexible display can always be in a flat state.

In addition, an embodiment of the present disclosure further includes a foldable mobile terminal, which includes a flexible display and an auxiliary device. The auxiliary device may be the auxiliary device described in the above embodiment. The flexible display is arranged on the auxiliary device, so that the flexible display can be always flattened during folding and flattening, so as to improve the service life of the flexible display screen.

Among them, the flexible display made of soft materials, flexible and can be curved, and paper-thin as even cut off the power, the content will not disappear.

The flexible display auxiliary device in the above embodiments includes a platform, a first stage, a second stage, a sliding mechanism and an enabling mechanism. Wherein the first stage is used for fixing the first end of the flexible display and the second stage is used for fixing the second end of the flexible display opposite to the first end; the first stage is fixedly arranged on the platform; the second stage is fixedly arranged on the sliding mechanism, the sliding mechanism is arranged on the platform, and the enabling mechanism is connected to the sliding mechanism to control the sliding mechanism to move on the platform to change the relative distance between the first stage and the second stage to change the tension on the flexible display screen. So that the flexible display can always be in a flat state when it is folded and flattened, so as to improve the service life of the flexible display.

The foregoing descriptions are merely embodiments of the present disclosure, and do not limit the scope of the present disclosure. All equivalent structures or equivalent changes made through the contents of the description and the drawings of the present disclosure or directly or indirectly applied to other related technical fields are similarly included in the protection scope of the present disclosure.

What is claimed is:

1. A flexible display auxiliary device, wherein the auxiliary device comprises: a platform, a first stage, a second stage, a sliding mechanism, and an enabling mechanism;
   wherein the first stage is configured to fix a first end of a flexible display, and the second stage is configured to fix a second end of the flexible display opposite to the first end;
   a first end surface of the first stage is arranged on the platform, and a second end surface of the first stage opposite to the first end surface is away from the platform, so that the first stage and the platform are set at a set angle;
   the second stage is fixedly arranged on the sliding mechanism, a sliding rail is arranged on the platform, the sliding mechanism is arranged on the sliding rail and is movable in an extending direction of the sliding rail, the enabling mechanism is connected to the sliding mechanism to control the sliding mechanism to move on the platform so as to change a relative distance between the first stage and the second stage, thereby a tension on the flexible display is changed;
   wherein a first rotation mechanism is arranged on the platform, a second rotation mechanism is arranged on the first end surface of the first stage, the second rotation mechanism is connected to the first rotation mechanism so that the first stage can rotate in an axial direction formed by the first rotation mechanism and the second rotation mechanism.

2. The auxiliary device according to claim 1, wherein the sliding rail is a convex strip, a strip-shaped groove is arranged on a side of the sliding mechanism facing the sliding rail, the convex strip is embedded in the groove so that the sliding mechanism moves along the extending direction of the convex strip.

3. The auxiliary device according to claim 1, wherein the sliding rail is further provided with at least two limit mechanisms, the at least two limit mechanisms are arranged at both ends of the sliding mechanism for locking the sliding mechanism when the sliding mechanism stops moving.

4. The auxiliary device according to claim 1, wherein the auxiliary device further comprises a processor and a sensor and a display connected to the processor;
the sensor is arranged in the sliding mechanism for detecting a displacement of the sliding mechanism;
the processor is configured to convert a magnitude of the displacement of the sliding mechanism detected by the sensor into an intensity value; and
the display is configured to display the intensity value.

5. The auxiliary device according to claim 1, wherein the auxiliary device further comprises a driving mechanism connected to the first stage and for controlling the first stage to rotate in the axial direction formed by the first rotation mechanism and the second rotation mechanism.

6. The auxiliary device according to claim 1, wherein the auxiliary device further comprises a pressing mechanism arranged between the first stage and the second stage for pressing the flexible display between the first stage and the second stage, so that the flexible display is in close contact with the first stage and the second stage.

7. A flexible display auxiliary device, wherein the auxiliary device comprises: a platform, a first stage, a second stage, a sliding mechanism, and an enabling mechanism;
wherein the first stage is configured to fix a first end of a flexible display, and the second stage is configured to fix a second end of the flexible display opposite to the first end;
the first stage is fixedly arranged on the platform;
the second stage is fixedly disposed on the sliding mechanism, the sliding mechanism is arranged on the platform, the enabling mechanism is connected to the sliding mechanism to control the sliding mechanism to move on the platform, a relative distance between the first stage and the second stage is changed so that a tension on the flexible display is changed;
wherein a first end surface of the first stage is arranged on the platform, and a second end surface of the first stage opposite to the first end surface is away from the platform, so that the first stage and the platform are set at a set angle;
wherein a first rotation mechanism is arranged on the platform, a second rotation mechanism is arranged on the first end surface of the first stage, the second rotation mechanism is connected to the first rotation mechanism so that the first stage can rotate in an axial direction formed by the first rotation mechanism and the second rotation mechanism.

8. The auxiliary device according to claim 7, wherein a sliding rail is arranged on the platform, the sliding mechanism is arranged on the sliding rail and is movable in an extending direction of the sliding rail.

9. The auxiliary device according to claim 8, wherein the sliding rail is a convex strip, a strip-shaped groove is arranged on a side of the sliding mechanism facing the sliding rail, the convex strip is embedded in the groove so that the sliding mechanism moves along the extending direction of the convex strip.

10. The auxiliary device according to claim 8, wherein the sliding rail is further provided with at least two limit mechanisms, the at least two limit mechanisms are arranged at both ends of the sliding mechanism for locking the sliding mechanism when the sliding mechanism stops moving.

11. The auxiliary device according to claim 7, wherein the auxiliary device further comprises a processor and a sensor and a display connected to the processor;
the sensor is arranged in the sliding mechanism for detecting a displacement of the sliding mechanism;
the processor is configured to convert a magnitude of the displacement of the sliding mechanism detected by the sensor into an intensity value; and
the display is configured to display the intensity value.

12. The auxiliary device according to claim 7, wherein the auxiliary device further comprises a driving mechanism connected to the first stage and for controlling the first stage to rotate in the axial direction formed by the first rotation mechanism and the second rotation mechanism.

13. The auxiliary device according to claim 7, wherein the auxiliary device further comprises a pressing mechanism arranged between the first stage and the second stage for pressing the flexible display between the first stage and the second stage, so that the flexible display is in close contact with the first stage and the second stage.

14. A foldable mobile terminal comprising a flexible display and an auxiliary device, wherein the auxiliary device comprises: a platform, a first stage, a second stage, a sliding mechanism, and an enabling mechanism;
wherein the first stage is configured to fix a first end of the flexible display, and the second stage is configured to fix a second end of the flexible display opposite to the first end;
the first stage is fixedly arranged on the platform;
the second stage is fixedly disposed on the sliding mechanism, the sliding mechanism is arranged on the platform, the enabling mechanism is connected to the sliding mechanism to control the sliding mechanism to move on the platform, a relative distance between the first stage and the second stage is changed so that a tension on the flexible display is changed;
wherein a first end surface of the first stage is arranged on the platform, and a second end surface of the first stage opposite to the first end surface is away from the platform, so that the first stage and the platform are set at a set angle;
wherein a first rotation mechanism is arranged on the platform, a second rotation mechanism is arranged on the first end surface of the first stage, the second rotation mechanism is connected to the first rotation mechanism so that the first stage can rotate in an axial direction formed by the first rotation mechanism and the second rotation mechanism.

15. The mobile terminal according to claim 14, wherein a sliding rail is arranged on the platform, the sliding mechanism is arranged on the sliding rail and is movable in an extending direction of the sliding rail.

16. The mobile terminal according to claim 14, wherein the auxiliary device further comprises a processor and a sensor and a display connected to the processor;
the sensor is arranged in the sliding mechanism for detecting a displacement of the sliding mechanism;
the processor is configured to convert a magnitude of the displacement of the sliding mechanism detected by the sensor into an intensity value; and
the display is configured to display the intensity value.

* * * * *